United States Patent [19]

Bolon et al.

[11] 3,968,056  
[45] July 6, 1976

[54] RADIATION CURABLE INKS

[75] Inventors: Donald A. Bolon, Scotia; Gary M. Lucas, Schenectady, both of N.Y.; Ralph L. Bartholomew, Painesville, Ohio

[73] Assignee: General Electric Company, Schenectady, N.Y.

[22] Filed: Sept. 27, 1974

[21] Appl. No.: 509,822

[52] U.S. Cl. .............................. 252/514; 252/501; 252/512; 106/31; 204/159.15; 204/159.23; 204/159.24; 428/411; 428/480; 428/500; 428/913
[51] Int. Cl.² ........................................ H01B 1/02
[58] Field of Search .......... 252/501, 511, 512, 514; 106/31; 260/28

[56] References Cited
UNITED STATES PATENTS

| | | | |
|---|---|---|---|
| 3,280,741 | 10/1966 | Seymour | 101/426 |
| 3,412,043 | 11/1968 | Gilliland | 252/514 |
| 3,661,614 | 5/1972 | Bassemir et al. | 260/86.1 E X |
| 3,673,140 | 6/1972 | Ackerman et al. | 260/28 X |
| 3,746,662 | 7/1973 | Adelman | 252/514 X |
| 3,875,094 | 4/1973 | Schroeter et al. | 260/28 |

FOREIGN PATENTS OR APPLICATIONS

| | | | |
|---|---|---|---|
| 33-4985 | 7/1958 | Japan | 252/511 |

*Primary Examiner*—Benjamin R. Padgett  
*Assistant Examiner*—E. Suzanne Parr  
*Attorney, Agent, or Firm*—William A. Teoli; Joseph T. Cohen; Jerome C. Squillaro

[57] ABSTRACT

A radiation curable ink is provided which is convertible to a conductive coating when cured on the surface of a substrate. A particulated electrically conductive metal containing material is used in combination with an organic resin binder. Low temperature cure of the ink can be achieved with either actinic or ionizing radiation.

15 Claims, 1 Drawing Figure

U.S. Patent   July 6, 1976   3,968,056
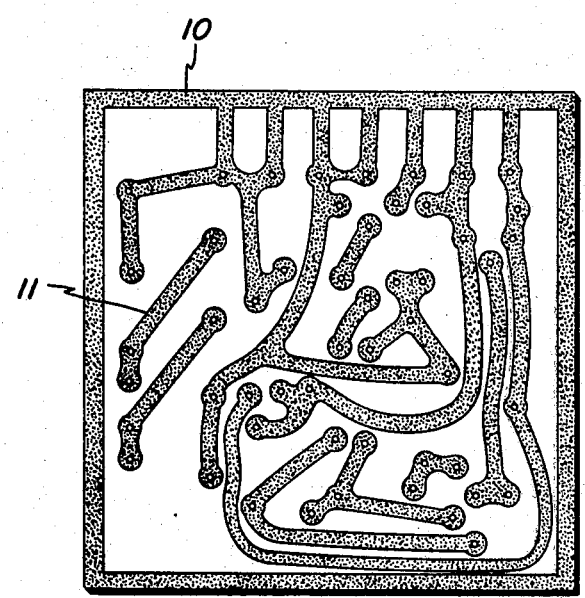

RADIATION CURABLE INKS

Prior to the present invention, various curable inks were available consisting of conductive particles or flakes in a matrix or binder in the form of an organic resin or a mixture of an organic resin and volatile solvent. These curable inks are used to make conductive coatings for circuit boards and ground coatings on electrical equipment among other things. Unlike the etching method for making circuit boards from copper clad laminates requiring a high degree of resolution in which a negative photo resist is used in combination with a mask, the direct employment of the curable conductive ink is often more convenient and economic in particular applications.

One form of a curable ink used to make conductive coatings consists of a metal powder or flake in combination with an organic binder and an organic solvent. Cure of the ink is achieved upon evaporation of the organic solvent. Although curable inks based on solvent evaporation can be rendered conductive without heating, such inks are nevertheless unsuitable on a variety of plastic substrates. In addition, a significant amount of air pollution is created. Another available curable ink becomes conductive upon firing at an elevated temperature. It is based on the use of a conductive power in combination with a glass as shown for example by J. E. Jolley, *Solid State Technology*, May 1974, pages 33—37. In order to render the ink conductive, it is necessary to fire the ink at temperatures up to 900° C. As a result, the conductive ink can only be employed on ceramic substrates which are able to withstand such extreme temperature conditions.

As shown by Ehrreich et al. U.S. Pat. No. 3,202,488 and Gillard U.S. Pat. No. 3,412,043, additional conductive inks are available based on the employment of an epoxy resin which can be employed in the form of either a one-package or two-package system. A low temperature cure can be achieved with the two-package epoxy system requiring a mixing of the curing catalyst immediately prior to use. However, two-package epoxy ink can be tacky for several hours before the resin cures. This drying cycle interferes with the use of the two-package epoxy system in screen printing applications where fast tack-free cures are necessary. In addition to remaining tacky too long, its relatively short pot-life limits its use to non-continuous batch operations. Although the one-package system allows for faster cures, higher temperatures are required to release the curing catalyst. Such epoxy systems are therefore often undesirable on thermoplastic substrates because of possible substrate damage occuring at high temperatures. In addition, where mass production procedures are contemplated, the use of two-package systems are not feasible.

Although recent improvements have eliminated the need for time consuming etching procedures for making circuit boards based on the direct application of conducting inks which can be cured in various ways, no curable conductive printing inks are available which can be rapidly cured within two minutes or less, and which can be used on a wide variety of substrates, including thermoplastic substrates.

The present invention is based on the discovery that certain radiation curable organic resins, which include UV curable resins (i.e., those that absorb light between 1849 and 4000 A), and which will be defined hereinafter, can be used in combination with certain particulated electrically conductive metal, or electrically conductive metal containing material, such as metal coated glass spheres or fibers, to produce a radiation curable ink which is rendered conductive upon radiation cure. A surprising feature of the present invention is that the shape of the particulated conductive material largely determines whether the radiation curable ink will cure satisfactorily to the conductive state. For example, unsatisfactory cures result, if the particulated electrically conductive metal containing material is in the form of flakes. Flakes are defined within the meaning of the present invention as being an electrically conductive metal containing material which have an aspect ratio D/T of greater than 20, where "D" is the diameter of the flake and "T" is the thickness. Experience has shown that the particulated electrically conductive metal containing material employed in the practice of the invention is preferably spherical, spheroidal or oblong spheroidal in shape. Although less desirable than spheres, metal fibers, or glass fibers coated with metal have been found to be more effective than metal flakes, with respect to allowing satisfactory cures of the photocurable ink when it is subjected to radiation cure. It has been found however, that up to about 15 percent by weight of flakes based on the weight of particulated electrically conductive metal containing material can be tolerated in the ink without adverse results.

There is provided by the present invention, a radiation curable ink convertible to a conductive coating exhibiting a specific resistivity of less than 10 ohm-cm when cured on the surface of a substrate using actinic radiation at a temperature of up to about 60° C. within 2 minutes or less, which radiation curable ink comprises by volume.

A. from about 10 to 60 percent of an organic resin binder having a viscosity of from 50 to 10,000 centipoises at 25° C., and B. from about 90 to 40 percent of a particulated electrically conductive metal containing material substantially free of metal containing material having an aspect ratio of diameter to thickness of a value of greater than 20.

Included by the particulated electrically conductive metal containing material which can be used in the practice of the invention are preferably silver coated glass spheres, or spheroids, sometimes referred to as "beads" which have an average diameter of about 6 to 125 microns and preferably 10 to 50. These materials are commercially available and are made from glass spheres commonly employed as reflective filler materials. Also included are particulated metals such as iron, zinc, nickel, copper, etc., which have average diameters as previously defined and are substantially free of a nonconductive oxide coating. Procedures for making such conductive particles by plating with silver, or initially priming with copper followed by plating with silver, or noble metals, are shown by Ehrreich U.S. Pat. No. 3,202,483. Glass fibers coated with silver, copper or nickel as shown for example in French patent No. 1,531,272 also can be used.

Particulated metals such as iron, nickel, copper, zinc, etc. in the forming of spheres, spheroids, or oblong spheroids, metal or fibers also can be used which have been subjected to a hydrogen or other reducing atmosphere at elevated temperatures to effect the removal of an amount of nonconducting oxide coating sufficient to render the metal particles conductive. The particulated metal in reduced form can be shielded from oxygen prior to being treated with the organic resin binder. The resulting radiation curable ink can be stored under sealed conditions prior to use.

Some of the organic resin binders which can be used in making the UV curable inks of the present invention in combination with the above-described conductive particulated material are in the form of either low molecular weight aliphatically unsaturated organic polymers, or a mixture of an aliphatically unsaturated organic polymer in further combination with a copolymerizable aliphatically unsaturated organic monomer such as styrene. The aforementioned solventless aliphatically unsaturated organic resin materials can have a viscosity of from about 50 to 10,000 centipoises at 25° C.

One variety of the solventless resins which can be employed in combination with the particulated electrically conductive metal containing material as described above, in the production of the UV curable conductive ink of the present invention, are low molecular weight polyimides containing acrylamide unsaturation, such as shown in U.S. Pat. No. 3,535,148, Ravve. These materials can be colorless liquids having relatively low viscosity. Another example is low molecular weight polyesters containing acrylic unsaturation shown by U.S. Pat. No. 3,567,494, Setko. Additional examples of solventless resins are acrylate esters, or methacrylic esters of polyhydric alcohols, such as shown by U.S. Pat. Nos. 3,551,246, and 3,551,235, Bassemir. Further examples are shown by Nass U.S. Pat. No. 3,551,311. In addition, there also is included acrylate or methacrylate esters of silicone resins, acrylate or methacrylate esters, melamine, epoxy resins, allyl ethers of polyhydric alcohols, allyl esters of polyfunctional aliphatic or aromatic acids, low molecular weight maleimido substituted aromatic compounds, cinnamic esters of polyfunctional alcohols, or mixtures of such compounds, etc.

The organic resin binder which can be used in combination with the above described particulated electrically conductive metal containing materials can be further defined as unsaturated polymers, for example, a polyester from a glycol and $\alpha,b$-unsaturated dicarboxylic acids, such as maleic and fumaric acids, with or without other dicarboxylic acids free of $\alpha,b$ unsaturation, such as phthalic, isophthalic, succinic, etc., dissolved in a copolymerizable aliphatically unsaturated organic solvent, such as styrene, vinyl toluene, divinyl benzene, methyl methacrylate, etc., or mixtures of such materials. Examples of such solventless resin compositions are shown by U.S. Pat. Nos. 2,673,151 and 3,326,710, Brody; a further example is shown by South African patent No. 694,724. Also included are unsaturated organosiloxanes having from 5 to 18 silicon atoms, which can be employed in combination with a vinylic organic monomer.

In instances where it is desired to make UV curable inks, UV sensitizers can be employed when the organic resin binder is in the form of a polyester or polyacrylate or other polymerizable UV curable material. There can be employed from about 0.5 to 5 percent by weight of the UV sensitizer based on the weight of resin. Included among the ultraviolet radiation photosensitizers which can be used are, for example, ketones such as benzophenone, acetophenone, benzil, benzyl methyl ketone; benzoins and substituted benzoins such as benzoin methyl ether, $\alpha$-hydroxymethyl benzoin isopropyl ether; sulfur compounds such as thiourea, aromatic disulfides, and other photosensitizers such as azides, thioketones, or mixtures thereof. There also can be used in the ink, UV stabilizers and antioxidants such as hydroquinone, tert butyl hydroquinone, tert butyl catechol, p-benzoquinone, 2,5-diphenylbenzoquinone, 2,6-di-tert-butyl-p-cresol, benzotriazoles such as Tinuvin P (manufactured by Geigy Corp.), hydroxybenzophenones, such as 2,4-hydroxybenzophenone, 2-hydroxy-4-methoxy-benzophenone, 4-dodecyl-2-hydroxybenzophenone, substituted acrylonitriles such as ethyl-2-cyano-3,3-diphenyl acrylate, 2-ethylhexyl-2-cyano-3,3-diphenyl acrylate, etc.

In addition, as shown by Gebhartt et al., Farbe und Lack 64 303(A58), small amounts of a paraffin wax, up to 2 percent by weight, such as a 135° F. MP can be incorporated into resins which contain polymerizable groups subject to oxygen inhibition. Such wax substantially reduces such oxygen inhibition which manifests itself as surface tack. Alternatively the wax may be omitted when radiation cures are to be conducted in an inert atmosphere. It also has been found that the conductivity of the cured ink can be impaired if chloride containing components are used which introduce more than 100 parts of chloride, per million of organic resin binder.

Additional examples of the organic resin binder which can be used in the practice of the invention are radiation curable epoxy compositions shown in copending applications of James Crivello, Ser. Nos. 466,374, 466,375, and 466,378, filed May 2, 1974, now abandoned, assigned to the same assignee as the present invention. These Crivello compositions are one-package radiation curable epoxy resins containing aromatic onium salts of the Group VIA elements, such as sulfur, aromatic halonium salts, and Group VA elements such as arsenic which break down under the influence of radiant energy to release a Friedel-Crafts catalyst such as borontrifluoride to effect the cure of the epoxy resin.

The epoxy resins which also can be utilized as the organic resin binder to produce the photo curable inks of the present invention includes any monomeric, dimeric or oligomeric or polymeric epoxy material containing one or a plurality of epoxy functional groups. Diluents such as 4-vinylcyclohexene dioxide, limonene dioxide, 1,2-cyclohexene oxide, styrene oxide, etc., may be added as viscosity modifying agents.

In the practice of the invention, the radiation curable ink can be made by simply blending the particulated electrically conductive metal containing material, which may be referred to hereinafter as the "conductive filler", with the organic resin binder, which hereinafter may be referred to as the resin.

Depending upon such factors as the viscosity of the resin, and the particle size and nature of the conductive filler, the resulting UV-curable ink can vary widely and can be a free flowing fluid or a paste. In instances where it is desired to make a U.V. curable conductive ink, a photosensitizer can be incorporated into the resin prior to blending with the conductive filler. There can be employed on a weight basis from about 0.5 part to 10 parts of filler per part of resin. If desired, electron beam cure of the ink also can be effected.

Blending can be achieved by simply stirring the ingredients in a suitable container. In instances where the conductive filler is in the form of particulated metal which has been freshly subjected to hydrogen reduction at temperatures of 300° to 800° C. to effect reduction of oxide coatings, or a chemical treatment involving the use of ammonium persulfate solution to dissolve the oxide coating a special blending technique is preferably employed. The resin can be treated with a dry inert gas, such as passing the gas under the resin surface along with agitation to remove any oxygen, or moisture therefrom. Blending with the freshly reduced filler is also achieved under sealed conditions such as a dry box. The resulting UV-curable conductive ink can be used in a standard manner to produce desirable conductive coatings, if radiated with ultraviolet light within a reasonable time after being applied to a substrate such as up to 10 minutes.

In order that those skilled in the art will be better able to practice the invention, the following examples are given by way of illustration, and not by way of limitation. All parts are by weight unless otherwise indicated.

EXAMPLE I

A polyester prepolymer was prepared by effecting reaction between about 35.3 parts of fumaric acid, 11.9 parts of dicyclopentadiene and 25.3 parts of propylene glycol. The resulting prepolymer was blended with about 24.4 parts of styrene containing 100 ppm of tert-butylhydroquinone and 1.8 parts of benzoin-sec-butylether along with 0.7 parts of 135° F. paraffin wax and warmed until a solution was obtained.

A photocurable ink was prepared by blending the above organic resin binder with 67 parts of silver coated glass spheres having an average diameter of about 10–50 microns. On a volume basis, there was employed about 2 volumes of conductive filler per volume of resin.

The above photocurable ink was printed onto a 2 inch by 6 inch polystyrene substrate in accordance with the procedure shown in our copending application Ser. No. 509,893 filed concurrently herewith and assigned to the same assignee as the present invention to the pattern shown in the drawing. The treated polystyrene substrate was then placed at a distance of about 8 inches from the arc tube of a General Electric H3T7 lamp which has been ballasted to permit operation at about 960 watts input. There was employed two quartz filters below the lamp having dimensions of about 5 inches × 10 inches. The filters were supported on steel supports which formed a channel through which air was blown. The upper filter support was in contact with a 6 foot copper coil having an average diameter of about three-eighths inch through which water was passed at about 25° C. The full intensity of the lamps was measured at about 20,000 $\mu\omega/cm^2$ and the temperature of the substrate did not exceed about 50° C. After a 2 minute cure, the ink on the panel was tested for continuity. Cure of the ink on the panel was determined by a bake cycle of 60 minutes at 70° C. after irradiation. If after 2 minutes exposure, the ink strip is tack free and it shows no more than a 2 percent weight loss based on the weight of tack-free ink, the ink is considered cured. It was found that the resulting conductive cured ink had a specific resistivity of 0.015 ohm-cm.

The cured ink in the circuit board was then evaluated for adhesion by flexing it at least 5 times sufficient to produce a distance of 1 inch between the center of the arc to an imaginary straight line drawn between the two ends of the board. No significant change in conductivity of the cured ink strip was found.

An abrasion test was also run on the connecting tabs by attaching the edge of the circuit board to a steel clamp at least 16 times, where the clamp spring had a compressive force of at least five times the weight of the board freely suspended. Although the clamp contacted the cured strip connecting tabs, no adhesive separation of the strip was noted and the specific resistivity of the cured strip remained substantially the same.

A further evaluation of the circuit board was made by exposing it to 96 percent relative humidity at a temperature of 120° F. for 14 days without allowing condensation of water on the surface of the board. It is found that the specific resistivity of the circuit board remains substantially unchanged.

A printing ink is made consisting of 33 parts of the above organic resin binder and 67 parts of silver flake having an aspect ratio greater than 20. A screen printed pattern from this ink does not photocure following the above described conditions. An irradiated strip has a specific resistivity of greater than 1000 ohm-cm. In addition, the strip is unsuitable as a circuit board material because it fails all of the above shown tests.

EXAMPLE II

A photocurable ink was prepared by blending together about 2 parts of the silver coated glass beads of Example I with one part of an organic resin binder consisting of 70 parts of the acrylated epoxidized soybean oil and 30 parts of ethylhexyl acrylate with 2 parts of the photosensitizer of Example I. Prior to mixing, the volume of the silver coated glass beads was approximately 2 times the volume of the organic resin binder.

The photocurable ink was applied onto a polystyrene substrate in accordance with the procedure of Example I and thereafter cured under ultraviolet light. The specific resistivity of the cured conductive coating was found to be 0.015 ohms-cm. After being subjected to the tests described in Example I, the specific resistivity on the circuit board does not substantially change. The conductive strip also exhibits substantially the same physical properties as defined in Example I.

EXAMPLE III

A photocurable ink was prepared by forming a blend of 2 parts of the silver coated beads of Example I and one part of an epoxy resin binder. The epoxy resin binder consisted of about 15 parts of vinylcyclohexene dioxide and 85 parts of (3,4-epoxycyclohexyl)-methyl-3,4-epoxycyclohexanecarboxylate. In addition, there was also utilized in the organic resin binder 2 parts of triphenylsulfoniumhexafluoro arsenate as a photosensitizer. Prior to mixing, it was found that the volume of the silver beads was approximately 2 times the volume of the binder resin.

The above described photocurable ink was printed onto a polyethyleneterephthalate resin substrate in accordance with the procedures described in Example I. It was subjected to ultraviolet radiation and cured within 2 minutes. It was found to have a volume resistivity of about 0.05 ohms-cm. This panel passed substantially all the tests described in Example I.

EXAMPLE IV

The procedure of Example I is repeated except that in place of the silver coated glass beads, there is employed copper coated glass beads where the copper has its oxide coating reduced by hydrogen. Hydrogen reduction is achieved by subjecting the copper coated glass beads to a hydrogen atmosphere for about 30 minutes at a temperature of about 400° C.

In accordance with the procedure of Example I, a photocurable ink is obtained which is found to have approximately the same conductivity upon cure on a polystyrene substrate as described in Example I. Physical testing of the cured strip also produces substantially the same results as shown in Example I.

EXAMPLE V

A photocurable resin is prepared by blending together about 5 parts of silver coated copper beads having an average particle size of about 200 microns with 1 part of the polyester resin of Example I containing the same photosensitizer. It is found that the volume of the silver coated copper beads is about the same as the volume of the organic resin binder prior to blending.

The above described photocurable ink is applied onto a polystyrene substrate as described in Example I patterned in accordance with the attached drawing. It is found that after the applied ink is cured in accordance with the procedure of Example I, its specific resistivity is less than about 0.1 ohm-cm. The circuit board is then subjected to the tests as described in Example I. The results are substantially the same as shown in Example I.

EXAMPLE VI

A photocurable ink is prepared by blending together about 5 parts of chemically treated copper powder having an average particle size of about 10 to 50 microns with one part of the polyester of Example I containing the same photosensitizer. The copper powder has been treated with a solution consisting of 240 parts of ammonium persulfate in 1000 parts of water, which has been purged with nitrogen, to effect removal of oxide coating on the copper. After the chemically reduced copper powder has been thoroughly dried by agitating it in a dry nitrogen atmosphere, the copper powder is then blended under nitrogen with the organic resin binder. It was found that about 5 parts of the copper powder is equivalent in volume to about 1 part of the polyester resin.

The photocurable ink is then applied onto a polystyrene substrate in accordance with the printing procedure of Example I. Upon cure of the ink within the 2 minutes using the same curing apparatus as described in Example I, the volume resistivity of the ink is found to be less than about 0.1 ohm-cm. The resulting circuit board satisfactorily passes tests described in Example I.

EXAMPLE VII

A photocurable ink is made in accordance with the procedure of Example I, except that a curable liquid polyene-polythiol composition, as shown in Example II of Lard U.S. Pat. No. 3,728,240, is used. There is employed 2 parts of silver coated glass spheres per part of the liquid polyene-polythiol resin.

A circuit board made in accordance with the procedure of Example I exhibits substantially the same specific resistivity and passes the physical tests and humidity test in a satisfactory manner.

Although the above examples are limited to only a few of the very many radiation curable printing inks within the scope of the present invention, it should be understood that the present invention is directed to a much broader class of printing inks based on the use of a wide variety of organic resin binders and particulated electrically conductive metal containing materials set forth in the description preceding these examples.

What we claim as new and desire to secure by Letters Patent of the United States is:

1. A screen printable radiation curable ink convertible to an abrasion resistant conductive coating exhibiting a specific resistivity of less than 10 ohm-cm when cured on the surface of a substrate consisting essentially of by volume
   A. from about 10 to 60 percent of a radiation curable organic resin binder having a viscosity of from about 50 to 10,000 centipoises at 25°C., and
   B. from about 90 to 40 percent of an electrically conductive filler consisting essentially of silver or copper containing particles with about 0 percent to about 15 percent by weight of silver or copper containing particles having an aspect ratio of diameter to thickness of a value greater than 20 based on the total weight of conductive filler.

2. A radiation curable ink in accordance with claim 1 where the electrically conductive filler is in the form of silver coated glass spheres.

3. A radiation curable ink in accordance with claim 1 where the electrically conductive filler is in the form of chemically reduced copper coated glass spheres.

4. A radiation curable ink in accordance with claim 1 where the electrically conductive filler is in the form of chemically reduced copper powder.

5. A radiation curable ink in accordance with claim 1, where the organic resin binder is in the form of a mixture of polyester prepolymer and styrene.

6. A radiation curable ink in accordance with claim 1, where the organic resin binder is in the form of a polyacrylate.

7. A radiation curable ink in accordance with claim 1, where the electrically conductive filler consists essentially of silver or copper containing spheres or spheroids having from about 0 percent to about 15 percent by weight of silver flake, based on the weight of conductive filler.

8. A radiation curable ink in accordance with claim 1, where the radiation curable resin is a polyester resin and the electrically conductive filler is in the form of sliver coated copper beads.

9. A radiation curable ink convertible to an abrasion resistant conductive coating exhibiting a specific resistivity of less than 10 ohm-cm when cured on the surface of a substrate consisting essentially of by volume
   A. from about 10 to 60 percent of an epoxy resin containing an effective amount of an aromatic onium salt selected from the class consisting of an onium salt of a Group VIA element, an onium salt of a Group VA element, and an aromatic halonium salt, and
   B. from about 90 to 40 percent of an electrically conductive filler consisting essentially of silver or copper containing particles having from about 0 percent to about 15 percent by weight of silver or copper containing particles having an aspect ratio of diameter to thickness of a value greater than 20 based on the total weight of conductive filler.

10. A radiation curable ink in accordance with claim 9, where the organic resin binder is in the form of a mixture of vinylcyclohexene dioxide, (3,4-epoxy cyclohexyl)-methyl-3,4-epoxy cyclohexane carboxylate and an effective amount of triphenylsulfonium hexafluoro arsenate.

11. A radiation curable ink in accordance with claim 9, where the electrically conductive filler consists essentially of sliver or copper containing spheres or spherioids having from about 0 to 15 percent by weight of silver flake, based on the weight of conductive filler.

12. A screen printable UV curable ink convertible to an abrasion resistant conductive coating exhibiting a specific resistivity of less than 10 ohm-cm when cured on the surface of a substrate consisting essentially of by volume
   A. from about 10 percent to 60 percent of a radiation curable organic resin binder having a viscosity of from about 50 to 10,000 centipoises at 25°C., and
   B. from about 90 percent to 40 percent of an electrically conductive filler consisting essentially of silver or copper containing particles with about 0 percent to about 15 percent by weight of silver or copper containing particles having an aspect ratio of diameter to thickness of a value greater than 20 based on the total weight of conductive filler, and
   C. from 0.5 to 5 percent by weight of a UV sensitizer based on the weight of (A).

13. A radiation curable ink in accordance with claim 12, comprising
   A. a polyester reaction product of propylene glycol, fumaric acid and dicyclo pentadiene,
   B. silver coated glass spheres having an average diameter of from about 10–50 microns.

14. A UV curable ink in accordance with claim 12, where the conductive filler consists essentially of silver or copper containing spheres or spheroids having from about 0 percent to about 15 percent by weight of silver flake based on the weight of conductive filler.

15. A screen printable radiation curable ink in accordance with claim 12, convertible to an abrasion resistant conductive coating capable of withstanding exposure to 96 percent relative humidity for 14 days at 120°F without a substantial change in its specific resistivity.

* * * * *